United States Patent [19]

Lebailly et al.

[11] 4,243,996

[45] Jan. 6, 1981

[54] ELECTROLUMINESCENT SEMICONDUCTOR DEVICE

[75] Inventors: Jacques Lebailly, Caen; Jacques Varon, Troarn, both of France

[73] Assignee: U.S. Philips Corporation, New York, N.Y.

[21] Appl. No.: 31,242

[22] Filed: Apr. 18, 1979

[30] Foreign Application Priority Data

Apr. 21, 1978 [FR] France .................................. 78 11857

[51] Int. Cl.³ ............................................. H01L 33/00
[52] U.S. Cl. ........................................ 357/17; 357/16; 357/18; 357/48
[58] Field of Search ..................... 357/17, 18, 16, 48

[56] References Cited

U.S. PATENT DOCUMENTS

| | | | |
|---|---|---|---|
| 4,011,113 | 3/1977 | Thompson | 148/175 |
| 4,068,252 | 1/1978 | Lebailly | 357/17 |
| 4,176,367 | 11/1979 | Uematsu | 357/19 |

*Primary Examiner*—Martin H. Edlow
*Attorney, Agent, or Firm*—Thomas A. Briody; Robert T. Mayer; James J. Cannon, Jr.

[57] ABSTRACT

An electroluminescent diode with photon recycling having an active electroluminescent second semiconductor layer present between a first and a third semiconductor layer with larger bandwidth and of opposite conductivity type. According to the invention, the active layer has a compensation factor of less than ⅓ and a thickness between 0.1 and 3 absorption lengths of the emitted radiation, the first semiconductor layer has a partially reflecting surface, and the third semiconductor layer has a reflecting surface with two preferably coplanar electrodes one of which is connected to the first semiconductor layer through a highly doped contact zone.

12 Claims, 2 Drawing Figures

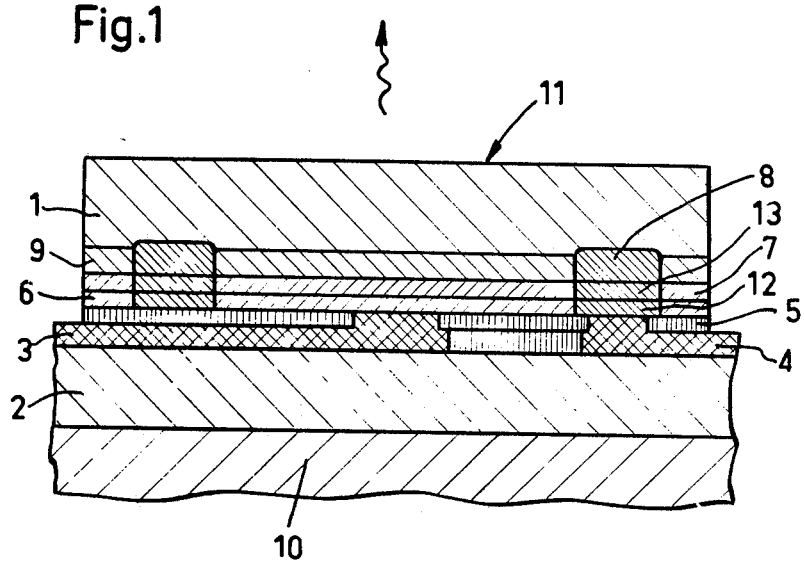
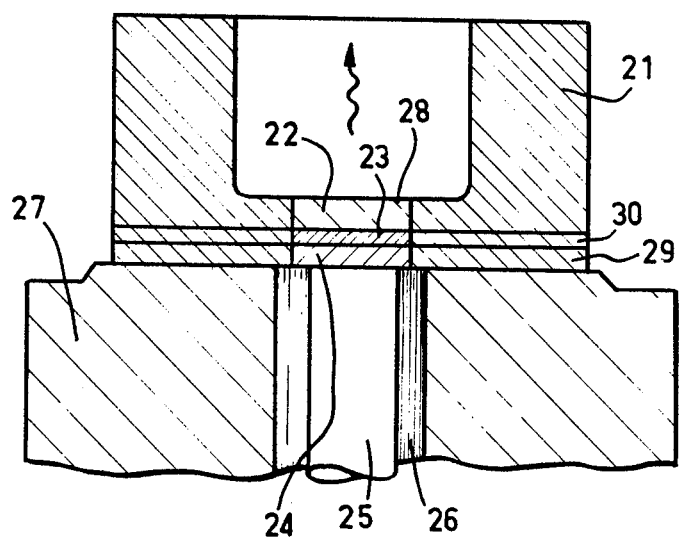

ELECTROLUMINESCENT SEMICONDUCTOR DEVICE

BACKGROUND OF THE INVENTION

1. Field of the Invention

The invention relates to a semiconductor device for generating electromagnetic radiation, comprising a semiconductor body having successively at least a first semiconductor layer of a first conductivity type, a second electroluminescent semiconductor layer and a third semiconductor layer of the second opposite conductivity type, the first and the third semiconductor layers having a larger forbidden bandwidth than the second semiconductor layer.

2. Description of the Prior Art

Such a semiconductor device is known from French Pat. specification No. 2.287.109.

In order to increase the external efficiency and the light flux of such hetero structures, it is endeavored to improve the mechanism of the radiation combinations and this in particular by increasing the doping concentration in the material of the relative region.

It is to be noted that "electroluminescent material" is to be understood to mean herein a material in which the doping concentration is such that the internal quantum efficiency is approximately 80% and preferably more than 90%, in which the doping concentration is as high as possible to improve the radiation recombination, but on the other hand is sufficiently low not to adversely influence the crystal quality of the material.

In order to increase the external quantum efficiency it is also endeavoured to reduce the internal absorption, which is possible either by reducing the thickness of the radiative region if this has a direct band structure and strongly absorbs the emitted radiation, or by reducing the thickness of the other regions which are traversed by the emitted radiation. For example, the thickness of the substrate should be reduced locally when the structure consists of a substrate having several superimposed layers and the radiation emanates on the side of the substrate.

As described in said French Patent Application, the last-mentioned structure has been improved by causing a part of the emitted radiation to reflect on the side walls of the radiative region. However, the surfaces which are considered for this lateral reflection of the emitted radiation are comparatively small since the radiative region itself is very thin. In addition, on the one hand the local reductions in thickness of the substrate and on the other hand the shaping of the side walls of the radiative region to improve the reflection of the emitted radiation are delicate operations which are not very compatible with mass production.

It is one of the objects of the invention to avoid these disadvantages, and to provide an electroluminescent device in the form of a hetero structure, the external quantum efficiency and the light flux of which are better than in the known device and the manufacture of which is compatible with mass production.

SUMMARY OF THE INVENTION

The invention uses inter alia the phenomenon of causing photons to be recycled again (which in technology is known as "photon recycling") according to which phenomenon a large part of the emitted radiation which is reflected by the crystal faces is absorbed in the electroluminescent material of the radiative region and generates charge carriers which recombine again while emitting radiation, which phenomenon may be repeated and in this manner may contribute to improving the luminous efficiency.

According to the invention a semiconductor device of the kind described in the opening paragraph is characterized in that the first semiconductor layer has a partially reflecting surface through which the radiation emanates, that the second layer shows a direct band structure and a compensation factor smaller than $\frac{1}{3}$, and has a thickness between 0.1 and 3 absorption lengths for the radiation, that the third semiconductor layer has a reflecting surface situated opposite to said partially reflecting surface and having two contact pads on which electrodes are provided, a highly doped contact zone of the first conductivity type extending from one of the contact pads down to the first layer.

It is to be noted that the expression "partially reflecting" when applied to a crystal face relates to a surface from which only a portion of the photons incident in the first instance emanates, in particular as a result of the critical angle which is determined by the difference between the reflective indices of the crystal and of the surroundings; an emanating face, for example, of a gallium arsenide crystal emitting an infrared isotropic radiation is partially reflecting due to the fact that at the interface between the crystal and the air, the critical angle is only 17°. The partial reflection of a surface may also be the result of the fact that the surface state thereof makes said surface dispersive or diffusing.

The radiation emitted by the second layer can, without any noteworthy absorption, penetrate through the second and third layers, the material of which has a larger forbidden band width. The radiation is reflected by the reflecting surface of the third layer and is partially reflected by the emanating face of the first layer; the thickness of the second layer is such that said reflected radiation is absorbed. Since the internal quantum efficiency of said layer is large as a result of its direct band structure and its doping concentration, the charge carriers formed in this manner recombine while emitting radiation; a particularly efficacious cascade of photon recycling occurs as a result of which the external quantum efficiency is much larger than without photon recycling.

It is furthermore to be noted that absorption length is to be understood to be the distance over which the radiation intensity decreases by a factor 1/e, where e is the base of the Neperian logarithms. For example, the absorption length of gallium-alluminum arsenide with a doping concentration of approximately $10^{18}$ atoms/cm$^3$ is approximately 3 microns. In this case the thickness of the active second layer is between 0.3 and 9 microns, preferably between 0.5 and 3 microns, with a doping concentration between $5.10^{17}$ and $5.10^{18}$ atoms/cm$^3$.

The thickness of the third layer being very small, the electroluminescent recombination region present in the second layer is situated very closely to the surface of the device which carries the electrodes, said surface being preferably in thermal contact with a heat sink. The equivalent thermal resistance is small and the device according to the invention can withstand very high current densities and in this manner may show a high luminous efficiency.

The compensation factor, in a region of a first conductivity type, is to be understood to mean the ratio between the concentration of minority doping atoms of the second opposite type and the concentration of the majority doping atoms of the first type. For example, in an n-type region the compensation factor is $N_A/N_D$, where $N_A$ is the acceptor concentration and $N_D$ is the donor concentration.

It is known that the compensation factor influences the recombination mechanism, in which the compensation results in an increase of the life of the radiation recombination and also in a shift of the spectrum of the emitted radiation to larger wavelengths which are farther remote from the intrinsic absorption threshold. With a compensation factor lower than $\frac{1}{3}$, the material of the electroluminescent layer of the device has a property which is necessary for a good efficiency and a good electroluminescence velocity, as a result of which the material is suitable for use of the photon recycling mechanism.

The electrodes of the diode of the device are preferably coplanar and said electrodes are situated on one flat surface which is present opposite to a likewise flat emanating surface, which simplifies the manufacture of the device. The device may take the form of a plate having plane parallel faces which is provided with contacts on one face, which simplifies the manufacture and permits large scale production, in particular when the plate has approximately the shape of a parallelepiped.

Dependent on the use of the device, the photon recycling mechanism may be used to a larger or to a smaller extent. For example, in the case of photocouplers and if the velocity of the device is not essential, it is advantageous to realize a strong repeated photon recycling by manufacturing a diode the area of which is comparatively large so that an important lateral expansion and multiple reflections of the emitted radiation are possible. Particularly in the case in which the device has to operate rapidly, it is to be preferred to limit the photon recycling by manufacturing a diode the area of which is comparatively small and the active layer is comparatively highly doped, which means an improvement of the brightness and also of the response time.

The first layer is preferably of the p-conductivity type, the second and third layers of the n-conductivity type (and hence the highly doped contact zone is of the p+ conductivity type). The advantage of such a structure is that the width of the electroluminescent spectrum of the n-conductive active region is smaller than the width of the electroluminescent spectrum of a p-conductive equivalent region, so that in the case of transport via optical fibres, the dispersion is reduced. Furthermore, the absorption in the thick p-conductive first layer is smaller than in an n-conductive equivalent layer. Moreover the n-conductive third layer has a better conductivity than an equivalent p-conductive layer due to the larger mobility of the electrons, while finally the diffusion of p-conductive dopants, for example zinc, creates better possibilities than the diffusion of n+ conductive dopants in a p-conductive material.

It is advantageous when the device comprises an intermediate layer which is situated between the first and the second layer and the composition and conductivity type of which are the same as that of the first layer, while said intermediate layer is more highly doped than the first layer but is lower doped than the contact zone. The intermediate layer provides the advantage of a better charge carrier injection in the active region. The intermediate layer is less highly doped than the contact zone so that when a current pulse in the forward direction occurs, the active junction becomes conductive before the junction between the active region and the contact zone becomes conductive.

The first layer or the assembly formed by the first layer and the intermediate layer should absorb a minimum of photons emitted by the active region. For that purpose, the thickness and the doping concentration thereof are minimum. The thickness depends on the mechanical behavior of the assembly formed by the layers of the device, the thicknesses of the second and third layers being very small so that they may not be loaded mechanically to any appreciable extent. In a device of III–V semiconductor material having a p-conductive epitaxial first layer the product of the thickness of the said first layer and the doping concentration thereof preferably is between $10^{13}$ cm$^{-2}$ and $10^{15}$ cm$^{-2}$.

If the thickness determined in this manner should give rise to too large a fragility, the device may comprise a thick peripheral portion and a central portion which corresponds to the luminescent zone of the active region and the thickness of which obtains the desired value due to a suitable etching treatment.

On the other hand, in a device III–V semiconductor material having an n-conductive epitaxial third layer, the product of the thickness and the doping concentration is preferably also between the values $10^{13}$ cm$^{-2}$ and $10^{15}$ cm$^{-2}$. In this manner the thickness of said layer is smaller than 5 microns and said thickness preferably is approximately 1 micron, while the doping concentration thereof is smaller than $10^{18}$ cm$^{-3}$ and preferably is equal to approximately $10^{17}$ cm$^{-3}$. In this manner the third layer is sufficiently transparent to the emitted radiation, while the electrical and thermal conductivity are also sufficiently high.

The device is preferably obtained through epitaxial growth on a substrate which can be removed afterwards or the thickness of which can be reduced, in which very weak compensation factors and a very good crystal quality can be realized by the said epitaxial growth.

According to a preferred embodiment, the materials used for the manufacture of the device are compounds of gallium, aluminum and arsenic; said materials permit on the one hand of epitaxially realizing differences in bandwidth without large deviations in the crystal lattice and on the other hand of obtaining interfaces with few crystal defects which might give rise to recombinations in which no radiation is emitted. In this case it is simple to realize the highly doped p+ conductive contact zone by a diffusion by means of a suitable impurity, for example zinc.

The electroluminescent material of the second layer is, for example, gallium aluminum arsenide ($Ga_{1-x}Al_xAs$) with $0 < x < 0.25$, while the materials of the first and third layers are compounds of gallium, aluminum and arsenic ($Ga_{1-y}Al_yAs$) where y is at least 0.1 larger than x; the material of the second layer is preferably $Ga_{1-x}Al_xAs$ with $0 < x < 0.15$, while the material of the first and third layers is $Ga_{1-y}Al_yAs$ with y substantially equal to $x + 0.2$.

When the material of the electroluminescent active region situated in the second layer is n-conductive gallium aluminum arsenide, the device can be realized simply by so-called liquid epitaxy. In the first instance, for example, an n-conductive layer is provided which is to form the third layer of the device, then an n-conductive layer is provided the composition of which comprises relatively less aluminum and which is to form the second layer of the device, while a p-conductive layer is then provided which is to form the first layer of the device and which preferably has a comparatively large thickness so that the mechanical rigidity of the device remains large after removing the substrate of gallium arsenide which was used as a support of the three layers. The epitaxial provision of the successive layers is preferably carried out in one growth process without the structure being removed from the growth apparatus.

Said epitaxial method has an important advantage: the active region obtained after providing a layer of the same conductivity type from a solution having the same dopants is not contaminated by dopants of the opposite conductivity type.

According to a modified embodiment, in the first instance a thick p-conductive layer is provided which forms the first layer, then the intermediate layer, if desired, after which the n-conductive active layer is provided and then also the n-conductive third layer of the device, in which, however, said layer contains more aluminum. The gallium arsenide substrate is then removed.

DESCRIPTION OF THE DRAWING

The invention will now be described in greater detail, by way of example, with reference to the accompanying drawing, in which FIG. 1 is a diagrammatic sectional view of a first embodiment of a semiconductor device according to the invention, FIG. 2 is a diagrammatic sectional view of a second embodiment of a semiconductor device according to the invention.

DESCRIPTION OF THE PREFERRED EMBODIMENTS

The device shown in FIG. 1 comprises a first layer 1 of gallium aluminum arsenide $Ga_{1-y}Al_yAs$, where $y=0.3$, doped with zinc to obtain a doping concentration of $10^{16}$ acceptor atoms/cm$^3$, an intermediate layer 9 of gallium aluminum arsenide of the same composition as the layer 1 but doped with zinc to obtain a doping concentration of $7.10^{17}$ acceptor atoms/cm$^3$, an active layer 7 of gallium aluminum arsenide $Ga_{1-x}Al_xAs$, where $x=0.1$, doped with tellurium to obtain a doping concentration of $5.10^{17}$ donor atoms/cm$^3$, and with a compensation factor which is smaller than 1/10, a third layer 6 of gallium aluminum arsenide the composition of which is approximately the same as that of the first layer $Ga_{0.7}Al_{0.3}As$ but which is n-conductive and has a doping concentration of $5.10^{16}$ donor atoms/cm$^3$.

The three layers 6, 7 and 9 have annular portions 12, 13 and 8, respectively, which are doped with zinc and have a doping concentration of approximately $10^{19}$ acceptor atoms/cm$^3$.

The face of the layer 6 opposite to the emissive face 11 is covered with an insulating layer 5 of silicon oxide $SiO_2$ which is doped with phosphorus to reduce the mechanical stresses, if any. Said layer 5 comprises windows; the contact pads situated in said windows are contacted with electrodes in the form of gold layers doped with zinc or beryllium. One of the said windows is situated at 4 and comprises the electrode of the highly doped p+ conductive annular contact zone 12 doped with germanium or silicon, while another window is situated at 3 and comprises the contact electrode of the central portion of the n-conductive layer 6.

The device is fixed on a metal base 10 which forms a heat sink, while between said sink and the electroluminescent diode a layer 2 of dielectric material of good thermal conductivity is provided, for example, a beryllium oxide plate which itself is metalized to be welded on one side to the base 12 and on the other side to the crystal.

The thickness of the layer 1 is 100 microns and that of the layer 9 is 3 microns, while the active layer has a thickness of 2 microns and the layer 6 has a thickness of apptoximately 1 micron.

When the diode is polarized in the forward direction, the central portion of the layer 7 emits an isotropic radiation which is partially reflected by the emanating face 11 and by the lower face of the layer 6, the layers 1, 9 and 6 being transparent to the said radiation due to their larger aluminum content, and the face 11 is partially reflecting due to the fact that the critical angle of total reflection at the interface is approximately 17°. The injection of free holes in the layer 7 is also due to the presence of the layer 9; the reflections at the outer surfaces give rise to a appreciable absorption of the radiation in the layer 7 associated with the generation of charge carriers which give rise to extra recombination radiation, said mechanisms of photon recycling being repeated and in this manner contributing to obtaining an external quantum efficiency of approximately 10%.

The semiconductor device shown in FIG. 2 comprises a very thick first layer 21 which has a cavity and hence in the center at 22 has a smaller thickness; said first layer has a flat portion 28, the bottom of the cavity, which is the emanating face for the radiation, an active layer 23 of a material the forbidden bandwidth of which is smaller than that of the material of the layer (21–22) and of the material of the underlying layer 24, said latter layer being the third layer of the diode.

The peripheral part 21, 30, 29 of the three layers is highly doped and has the same conductivity type as the central portion 22 of the first layer, hence opposite to that of the layers 23 and 24.

The lower face of the diode contacts the coaxial contact electrodes 25 and 27 which are insulated from each other by a dielectric 26. Said electrodes form the base on which the diode can be connected and also form a heat sink.

The device shown in FIG. 2 is formed by the same semiconductor materials as that of the diode shown in FIG. 1 but with different doping concentrations and different dimensions. The thickness of the peripheral part 29-30-21 is 300 microns and the doping concentration in the said part is $2.10^{19}$ acceptor atoms/cm$^3$, the thickness of the central portion of the p-conductive layer 22 is 10 microns and the doping concentration thereof is $5.10^{17}$ acceptor atoms/cm$^3$; the thickness of the n-conductive active region 23 is 0.5 micron to 2 microns and this part contains $10^{18}$ to $5.10^{18}$ donor atoms/cm$^3$ with a compensation factor <0.2; finally the thickness of the central portion of the n-conductive layer 24 is smaller than 2 microns and this central portion contains less than $10^{17}$ donor atoms/cm$^3$.

The light-emissive diode shown in FIG. 1 is a diode for general use which is destined, for example, to realize photocouplers. The diode described with reference to FIG. 2 having a smaller area is less expanded laterally, which means a limitation of the number of successive photon recycling steps, but the active zone is more highly doped than the active zone of the diode shown in FIG. 1; this has for its result that the diodes of the second type are more rapid and brighter. Said diodes are particularly useful in devices for communication through optical fibers.

What is claimed is:

1. A semiconductor device for generating electromagnetic radiation, comprising a semiconductor body having successively at least a first semiconductor layer of a first conductivity type, a second electroluminescent semiconductor layer and a third semiconductor layer of the second opposite conductivity type, the first and the third semiconductor layer having a larger forbidden bandwidth than the second semiconductor layer, characterized in that the first semiconductor layer has a partially reflecting surface through which the radiation emanates, that the second layer shows a direct band structure and a compensation factor smaller than $\frac{1}{3}$, and has a thickness between 0.1 and 3 absorption lengths for the radiation, that the third semiconductor layer has a reflecting surface situated opposite to the said partially reflecting surface and having two contact pads on which electrodes are provided, a highly doped contact zone of the first conductivity type extending from one of the contact pads down to the first layer.

2. A semiconductor device as claimed in claim 1, characterized in that the first layer is p-conductive and the second semiconductor layer is n-conductive.

3. A semiconductor device as claimed in claim 2, characterized in that the second semiconductor layer consists of gallium aluminum arsenide of the composition $Ga_{1-x}Al_xAs$ ($0<x<0.25$) and the first and third semiconductor layers consist of gallium aluminum arsenide having a composition $Ga_{1-y}Al_yAs$ ($y \geq x+0.1$).

4. A semiconductor device as claimed in claim 3, characterized in that the second semiconductor layer has a composition $Ga_{1-x}Al_xAs$ ($0<x<0.15$) and the first and third semiconductor layers have a composition $Ga_{1-y}Al_yAs$ where y is substantially equal to $x+0.2$.

5. A semiconductor device as claimed in claim 1, characterized in that an intermediate layer of the same conductivity type as the first layer and having a higher doping concentration than the first layer and a lower doping concentration than the contact zone is provided between the first and second semiconductor layers.

6. A semiconductor device as claimed in claim 1, characterized in that the second semiconductor layer has a thickness between 0.5 and 3 μm and a doping concentration between $5.10^{17}$ atoms/cm$^3$ and $5.10^{18}$ atoms/cm$^3$.

7. A semiconductor device as claimed in claim 1, characterized in that the product of the thickness in cm and the doping concentration in atoms/cm$^3$ for the first and third semiconductor layers is between $10^{13}$ and $10^{15}$ cm$^{-2}$.

8. A semiconductor device as claimed in claim 1, characterized in that the third semiconductor layer has a thickness of at most 5 μm and a doping concentration of at most $10^{18}$ atoms/cm$^3$.

9. A semiconductor device as claimed in claim 8, characterized in that the third semiconductor layer has a thickness of at most 2 μm and a doping concentration of at most $10^{17}$ atoms/cm$^3$.

10. A semiconductor device as claimed in claim 1, characterized in that the reflecting surface of the third embodiment layer beyond the contact pads is covered with an insulating layer.

11. A semiconductor device as claimed in claim 1, characterized in that the radiation emanates from the bottom of a cavity provided in the first layer.

12. A semiconductor device as claimed in claim 11, characterized in that the electrodes are coaxial, the outermost electrode adjoining through the contact zone the portion of the first layer surrounding the cavity.

* * * * *

UNITED STATES PATENT AND TRADEMARK OFFICE
CERTIFICATE OF CORRECTION

PATENT NO. : 4,243,996

DATED : January 6, 1981

INVENTOR(S) : JACQUES LEBAILLY ET AL

It is certified that error appears in the above—identified patent and that said Letters Patent is hereby corrected as shown below:

Claim 10, Line 3 "embodiment" should be --semiconductor--.

Signed and Sealed this

Third Day of January 1984

[SEAL]

Attest:

GERALD J. MOSSINGHOFF

Attesting Officer

Commissioner of Patents and Trademarks